(12) United States Patent
Kurupati

(10) Patent No.: US 6,769,047 B2
(45) Date of Patent: Jul. 27, 2004

(54) METHOD AND SYSTEM FOR MAXIMIZING DRAM MEMORY BANDWIDTH THROUGH STORING MEMORY BANK INDEXES IN ASSOCIATED BUFFERS

(75) Inventor: Sreenath Kurupati, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 10/103,956

(22) Filed: Mar. 21, 2002

(65) Prior Publication Data

US 2003/0182490 A1 Sep. 25, 2003

(51) Int. Cl.[7] .............................................. G06F 12/00
(52) U.S. Cl. ..................... 711/5; 711/104; 711/150; 711/151; 711/167; 711/168; 711/169
(58) Field of Search ............... 711/5, 104, 105, 711/150, 151, 167–169

(56) References Cited

U.S. PATENT DOCUMENTS

| 6,510,474 B1 | * | 1/2003 | Stracovsky et al. | ........... 710/58 |
|---|---|---|---|---|
| 6,539,440 B1 | * | 3/2003 | Stracovsky et al. | ........... 710/58 |
| 6,546,453 B1 | * | 4/2003 | Kessler et al. | .................. 711/5 |
| 6,571,307 B1 | * | 5/2003 | Kuo et al. | ................... 710/305 |
| 6,587,894 B1 | * | 7/2003 | Stracovsky et al. | ............ 710/6 |
| 6,587,920 B2 | * | 7/2003 | Mekhiel | ..................... 711/118 |
| 6,671,788 B2 | * | 12/2003 | Shinozaki | ................... 711/167 |
| 2001/0033508 A1 | | 10/2001 | Waller | |

* cited by examiner

Primary Examiner—T. Nguyen
(74) Attorney, Agent, or Firm—Blakely, Sokoloff, Taylor & Zafman LLP

(57) ABSTRACT

A method and system for maximizing DRAM memory bandwidth is provided. The system includes a plurality of buffers to store a plurality of data units, a selector coupled to the buffers to select the buffer to which a data unit is to be stored, and logic coupled to the buffers to schedule an access of one of a corresponding number of memory banks based on the buffer in which the data unit is stored. The system receives a data unit, computes an index based on at least a portion of the data unit, selects a buffer in which to store the data unit based on the index, stores the data unit in the selected buffer, schedules a memory bank access based on the index, reads the data unit from the selected buffer, and accesses the memory bank.

28 Claims, 4 Drawing Sheets

METHOD AND SYSTEM FOR MAXIMIZING DRAM MEMORY BANDWIDTH THROUGH STORING MEMORY BANK INDEXES IN ASSOCIATED BUFFERS

BACKGROUND

1. Field

Embodiments of the invention relate to the field of Dynamic Random Access Memory (DRAM), and more specifically, to maximizing DRAM memory bandwidth.

2. Background Information and Description of Related Art

Information may be stored in different types of memory. A Dynamic Random Access Memory (DRAM) chip is cheaper than an equivalent Static Random Access Memory (SRAM) chip. However, DRAM needs to be refreshed after each access before another access can be made. Therefore, after a bank in the DRAM is accessed, a system must wait until the bank is refreshed, and therefore, usable again before another access to that same bank can be made. This lowers bandwidth usage and information processing rates. One solution is to duplicate entries in all the banks in the DRAM. However, this eliminates the cost advantage of using DRAMs instead of SRAMs.

BRIEF DESCRIPTION OF DRAWINGS

The invention may best be understood by referring to the following description and accompanying drawings that are used to illustrate embodiments of the invention. In the drawings.

DETAILED DESCRIPTION

Embodiments of a system and method for maximizing DRAM memory bandwidth are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
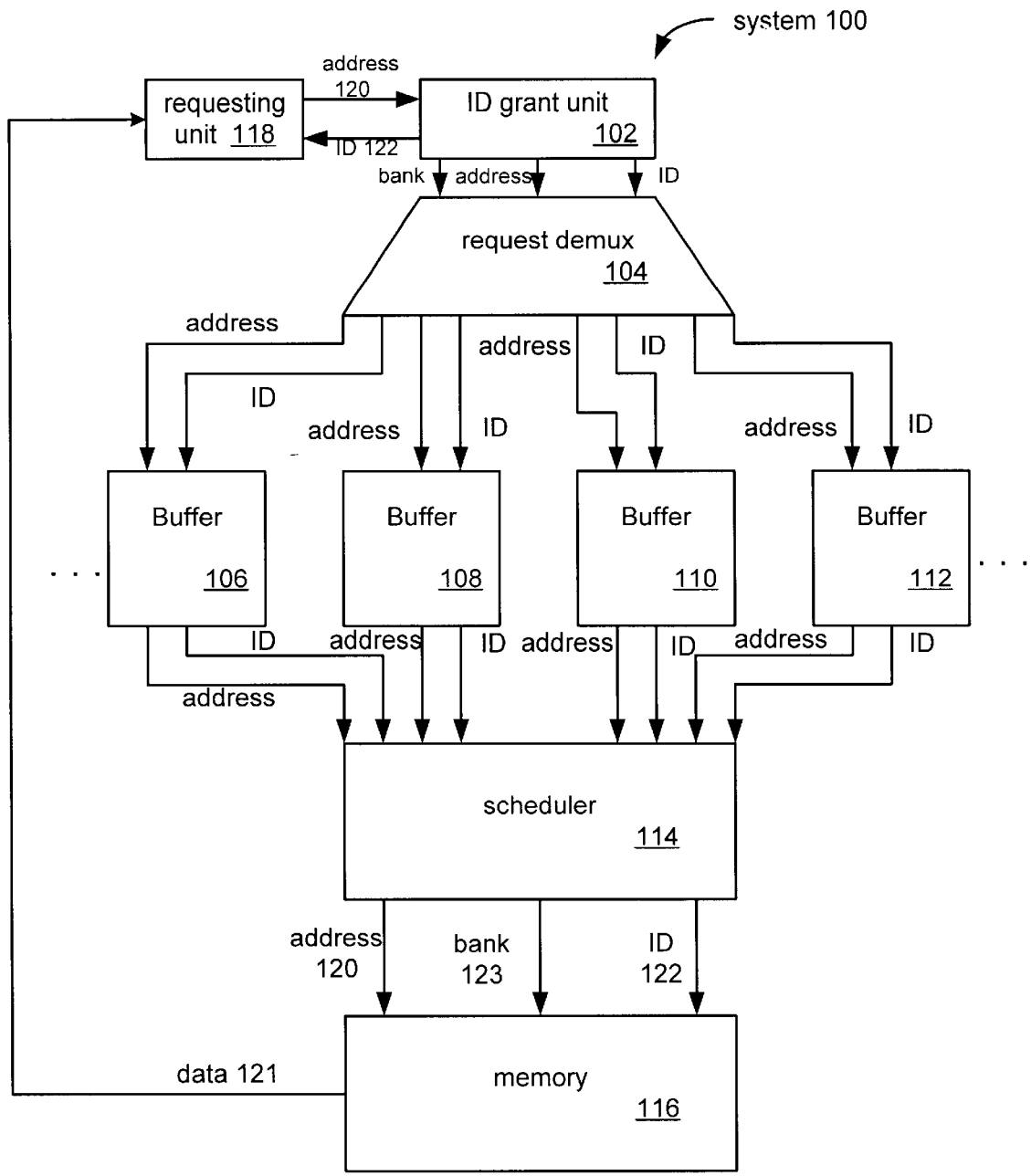
FIG. 1 is a block diagram illustrating one embodiment a system implementing the invention.

Referring to FIG. 1, a block diagram illustrates a system 100 according to one embodiment of the invention. Those of ordinary skill in the art will appreciate that the system 100 may include more components than those shown in FIG. 1. However, it is not necessary that all of these generally conventional components be shown in order to disclose an illustrative embodiment for practicing the invention. System 100 contains a memory 116. In one embodiment of the invention, the memory 116 is a dynamic random access memory (DRAM). Memory 116 has a plurality of memory banks.

System 100 has a plurality of buffers. The number of buffers is based on the number of memory banks in the memory 116. In one embodiment of the invention, the number of buffers is equal to the number of memory banks in the memory. In one embodiment of the invention, each buffer corresponds to a different memory bank in the memory. For example, if memory 116 has four memory banks, system 100 may have four buffers 106, 108, 110, and 112.

System 100 has a scheduler 114 to schedule accesses of memory based on the memory bank to be accessed. System 100 has a selector 104. In one embodiment of the invention, the selector is a demultiplexer (demux). The selector 104 selects the buffer to which a data unit 120 is to be stored based on at least a portion of the data unit. In one embodiment of the invention, the selector selects the buffer that corresponds to the memory bank that will be accessed. In one embodiment of the invention, the data unit 120 is an address.

In one embodiment of the invention, system 100 has an identification grant unit 102 that receives a data unit 120 from a requesting unit 118 and determines an identification number (ID) 122 for the data unit. In one embodiment, the requesting unit is a processor or other computing device. The ID grant unit 102 sends the ID 122 back to the requesting unit 118 and sends the data unit 120 and the ID 122 to the selector 104. The selector 104 then sends the data unit 120 and the ID 122 to the buffer corresponding to the bank to be accessed.

In one embodiment of the invention, the selector 104 determines if the data unit has already been stored in the selected buffer by searching the selected buffer. If a match is not found, the data unit is stored in the buffer. If a match is found, the data unit need not be stored, and the ID of the data unit is appended to the entry in the buffer comprising the data unit. Thus, a data unit may be associated with multiple different IDs.

The buffers store data units until the data units are retrieved to access the memory. The scheduler 114 determines in which order the data units will be retrieved from the buffers. In one embodiment of the invention, the scheduler schedules the accesses of memory so that there are sequential accesses of different memory banks. In one embodiment of the invention, the scheduler schedules one access of memory for each entry in each buffer. Each entry in a buffer comprises a data unit and one or more IDs. Therefore, one scheduled access satisfies more than one request if multiple IDs are appended to the buffer entry. In one embodiment of the invention, after memory 116 is accessed with the data unit 120, the data 121 retrieved from memory 116 is sent to the requesting unit 118.

Figure 2:
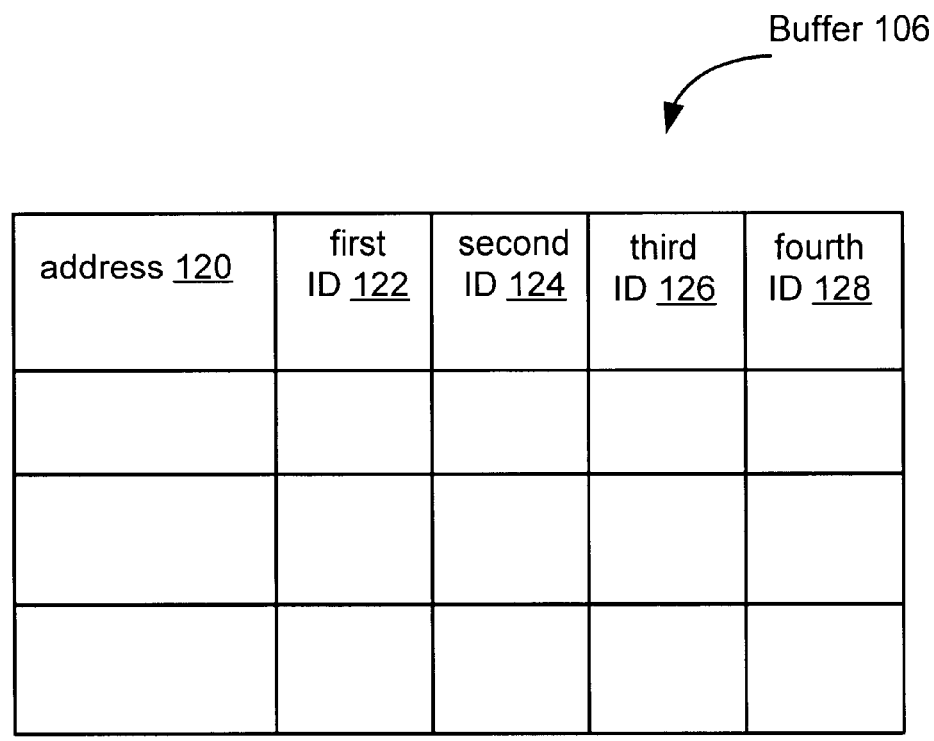
FIG. 2 illustrates one embodiment of a buffer according to the invention.

FIG. 2 illustrates one embodiment of a buffer according to the invention. The buffer 116 has one or more entries. Each entry has a plurality of fields. One field stores the data unit 120. In one embodiment of the invention, the data unit 120 is an address. Another field stores the ID 122. A third field stores a second ID 124. Other fields may store further IDs and other information.

Figure 3:
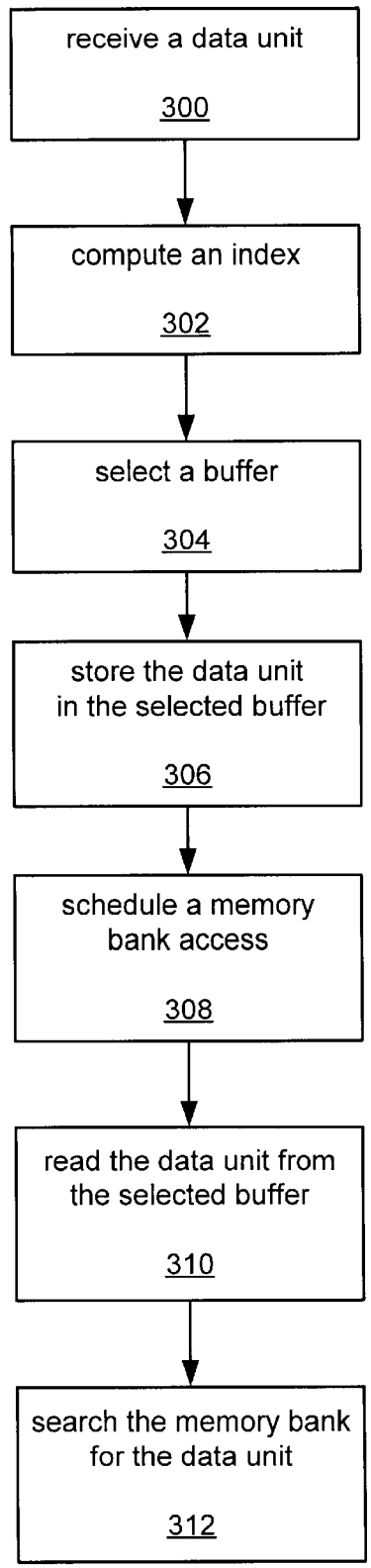
FIG. 3 is a flow chart that illustrates one embodiment of the method of the invention.

FIG. 3 is a flow chart that illustrates one embodiment of the method of the invention. First, at 300, a data unit is received from a requesting unit. In one embodiment of the invention, the data unit comprises an address. In one embodiment of the invention, an ID is generated to identify the requester or the source of the data unit. The ID may be sent back to the requesting unit.

Then, at 302, an index is computed based on at least a portion of the data unit. Then, at 304, a buffer is selected in which to store the data unit based on the index. In one embodiment of the invention, the index corresponds to the bank in memory which will be accessed. Then, at 306, the data unit is stored in the selected buffer. In one embodiment of the invention, the data unit is stored along with an ID that identifies the source of the data unit. In one embodiment of the invention, the selected buffer is searched to determine if there is an entry that comprises the data unit. If no is match found, then the data unit is stored in the selected buffer. If a match is found, then the data unit need not be stored, and the ID for the data unit is appended to the entry comprising the data unit.

Then, at 308, a memory bank access is scheduled based on the index. In one embodiment of the invention, the memory access is scheduled so that sequential accesses to memory occur at different memory banks. Next, at 310, the data unit from which the index was computed is read from the selected buffer. In one embodiment of the invention, the data unit and the one or more IDs that identify the data unit are read from the selected buffer. Then, at 312, the memory bank is accessed as scheduled to search for an entry in the memory bank matching the data unit.

Figure 4:
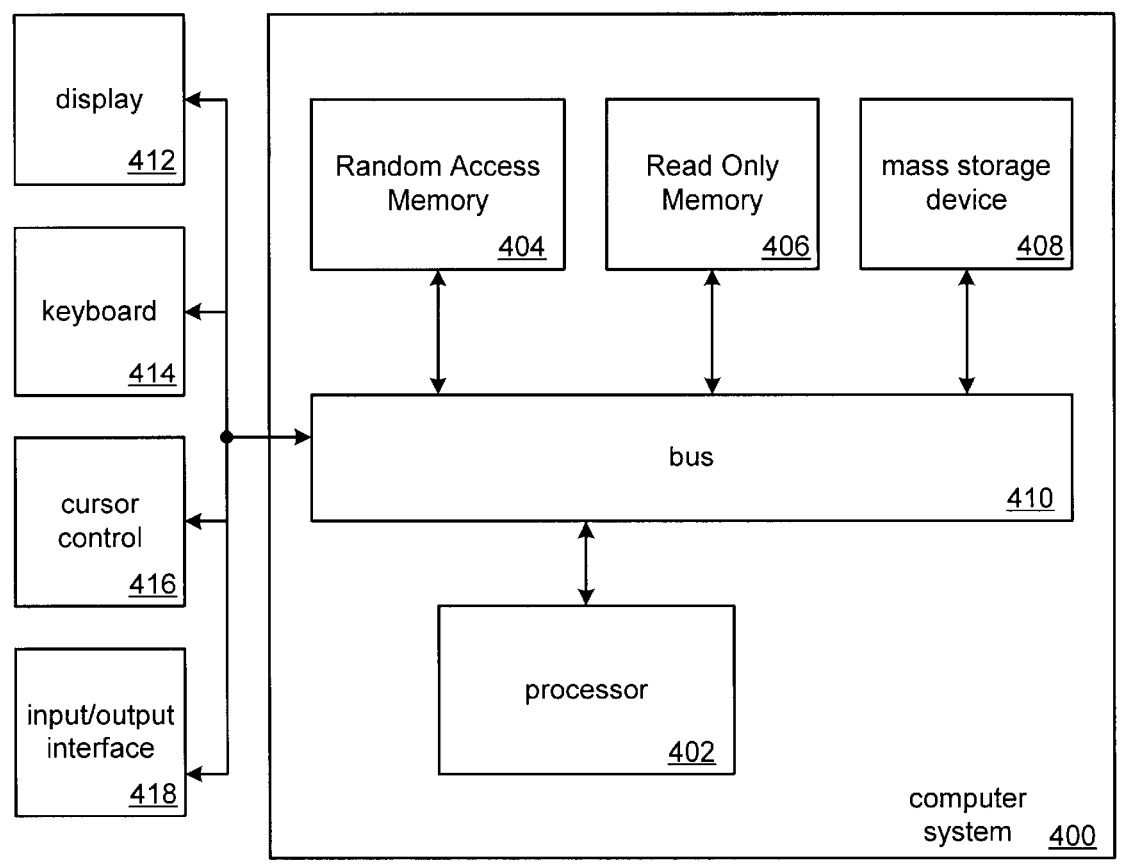
FIG. 4 is a block diagram of a computer system which may be used to implement an embodiment of the invention.

FIG. 4 illustrates a block diagram of a computer system 400 that may be used to implement an embodiment of the invention. The computer system 400 includes a processor 402 coupled through a bus 410 to a random access memory (RAM) 404, a read-only memory (ROM) 406, and a mass storage device 408. Mass storage device 408 represents a persistent data storage device, such a floppy disk drive, fixed disk drive (e.g. magnetic, optical, magneto-optical, or the like), or streaming tape drive. Processor 402 may be embodied in a general purpose processor, a special purpose processor, or a specifically programmed logic device.

Display device 412 is coupled to processor 402 through bus 410 and provides graphical output for computer system 400. Keyboard 414 and cursor control unit 416 are coupled to bus 410 for communicating information and command selections to processor 402. Also coupled to processor 402 through bus 410 is an input/output (I/O) interface 418, which can be used to control and transfer data to electronic devices (printers, other computers, etc.) connected to computer system 400.

In one embodiment of the invention, the requesting unit 118 is the processor 402 that requests access of one of the memory banks in memory 116. In one embodiment of the invention, the memory 116 is the random access memory 404 that is coupled to the processor 402 via bus 410.

It should be noted that the architecture of FIG. 4 is provided only for purposes of illustration, and that a computer used in conjunction with embodiments of the invention are not limited to this specific architecture.

As will be appreciated by those skilled in the art, the content for implementing an embodiment of the method of the invention, for example, computer program instructions, may be provided by any machine-readable media which can store data that is accessible by system 100, as part of or in addition to memory, including but not limited to cartridges, magnetic cassettes, flash memory cards, digital video disks, random access memories (RAMs), read-only memories (ROMs), and the like. In this regard, the system 100 is equipped to communicate with such machine-readable media in a manner well-known in the art.

It will be further appreciated by those skilled in the art that the content for implementing an embodiment of the method of the invention may be provided to the system 100 from any external device capable of storing the content and communicating the content to the system 100. For example, in one embodiment, the system 100 may be connected to a network, and the content may be stored on any device in the network.

An illustrative example of one embodiment of the method of the invention will now be described. For purposes of illustration, the memory 116 has four memory banks and the system 100 has four buffers 106, 108, 110, and 112. Each buffer corresponds to a different memory bank. The example uses a hashing scheme in which the two least significant bits (lsb) of an address determine which memory bank will be accessed. The same hashing scheme will be used to determine in which buffer to store the address. For example, if the two lsb are 00, then the address will be stored in the first buffer 106, and the first memory bank will be accessed. If the two lsb are 01, the address will be stored in the second buffer 108, and the second memory bank will be accessed. If the two lsb are 10, the address will be stored in the third buffer 110, and the third memory bank will be accessed. If the two lsb are 11, the address will be stored in the last buffer 112, and the last memory bank will be accessed.

Suppose that a first requesting unit requests an address of 010011. Since the two lsb of the address are 11, the address will be stored in the last buffer. An ID is generated to identify the request, for example, an ID of 000. The last buffer will be searched to determine if the address 010011 has already been stored in the last buffer. Suppose that the four buffers are empty. Therefore, no entry matching the address will be found. Thus, the address of 010011 and ID of 000 are stored in the last buffer.

Suppose a second request is for the address 011111. Since the two lsb of the address are 11, the address will be stored in the last buffer. An ID of 001 is generated for the request. The last buffer will be searched to determine if the address 011111 has already been stored in the last buffer. No match is found, so the address 011111 and ID of 001 are stored in the last buffer.

Suppose a third request is for the address 000001. Since the two lsb of the address are 01, the address will be stored in the second buffer. An ID of 010 is generated for the request. The second buffer will be searched to determine if the address 000001 has already been stored in the second buffer. No match is found, so the address 000001 and ID of 010 are stored in the second buffer.

Suppose a fourth request is for address 011111. Since the two lsb of the address are 11, the address will be stored in the last buffer. An ID of 011 is generated for the request. The last buffer will be searched to determine if the address 011111 has already been stored in the last buffer. There is a match, since the address 011111 was stored in the last buffer after the second request. Therefore, the address 011111 need not be stored, and the second entry in the last buffer will be appended with the ID 011. Thus, the second entry in the last buffer will comprise the address 011111, the ID of 001, and the ID of 011.

Suppose a fifth request is for address 000010. Since the two lsb of the address are 10, the address will be stored in the third buffer. An ID of 100 is generated for the request. The third buffer will be searched to determine if the address 000010 has already been stored in the third buffer. No match is found, so the address 000010 and ID of 100 is stored in the third buffer.

The scheduler will schedule the five requests according to the buffers in which the addresses are stored. The scheduler will schedule the requests so that there are sequential accesses of different memory banks. This maximizes memory bandwidth for the accesses, since a memory bank may need time to recover from a memory access before it is capable of being accessed again. The scheduler will schedule the requests so that there is one access of memory for each entry in each buffer. Therefore, one access satisfies more than one request if multiple IDs are appended to the buffer entry.

In this example, the scheduler will schedule the first access of memory using the first entry in the last buffer (from the first request). The address 010011 and the ID 000 are retrieved from the last buffer, and the last memory bank is accessed to search for the address 010011. The scheduler will schedule the second access of memory using the first entry in the second buffer (from the third request). The address 000001 and the ID 010 are retrieved from the second buffer, and the second memory bank is accessed to search for the address 000001. The scheduler will schedule the third access of memory using the second entry in the last buffer (from the second and fourth requests). The address 011111 and the IDs 001 and 011 are retrieved from the last buffer, and the last memory bank is accessed to search for the address 011111. The scheduler will schedule the fourth access of memory using the first entry in the third buffer (from the fifth request). The address 000010 and ID 100 are retrieved from the third buffer, and the third memory bank is accessed to search for the address 000010.

The third request is scheduled before the second request because the second request accesses the same memory bank as the first request. By scheduling the third request before the second request, the last memory bank will have time to refresh and recover from the first memory access while another memory bank is accessed to satisfy the third request. Also, since the second and fourth requests are for the same address, the scheduler can schedule them together so that one memory access satisfies both requests.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   receiving a data unit;
   computing an index based on at least a portion of the data unit;
   selecting a buffer in which to store the data unit based on the index;
   storing the data unit in the selected buffer;
   scheduling a memory bank access based on the index;
   reading the data unit from which the index was computed from the selected buffer; and
   accessing the memory bank as scheduled to search for an entry in the memory bank matching the data unit.

2. The method of claim 1, wherein the data unit comprises an address.

3. The method of claim 1, further comprising generating an identification number for the data unit and wherein storing the data unit in the selected buffer comprises storing the identification number in the selected buffer along with the data unit.

4. The method of claim 3, wherein receiving a data unit further comprises receiving a data unit from a requesting unit, and further comprising sending the identification number for the data unit to the requesting unit.

5. The method of claim 1, further comprising searching the selected buffer for an entry matching the data unit and wherein storing the data unit in the selected buffer comprises storing the data unit in the selected buffer if no match is found.

6. An apparatus comprising:
   a plurality of buffers to store a plurality of data units, the number of buffers based on the number of memory banks in a memory;
   a selector coupled to the plurality of buffers to select the buffer to which the data unit is to be stored based on at least a portion of the data unit; and
   logic coupled to the plurality of buffers to schedule an access of one of the memory banks based on the buffer in which the data unit is stored.

7. The apparatus of claim 6, wherein each buffer corresponds to a different memory bank in the memory.

8. The apparatus of claim 7, wherein the logic coupled to the plurality of buffers to schedule an access of the memory further comprises logic coupled to the plurality of buffers to schedule an access of the memory bank in the memory based on the corresponding buffer in which the data unit is stored.

9. The apparatus of claim 6, further comprising logic coupled to the selector to generate an identification number for each of the plurality of data units, the identification number to be stored in the selected buffer along with the corresponding data unit.

10. The apparatus of claim 6, wherein the logic to schedule an access of the memory comprises logic to schedule sequential accesses of different memory banks.

11. The apparatus of claim 6, further comprising logic coupled to the plurality of buffers to determine if the data unit has already been stored in the buffer and appending the entry comprising the data unit with the identification number of the data unit if the data unit has already been stored in the buffer.

12. The apparatus of claim 11, wherein the logic to schedule an access of the memory comprises logic to schedule one access of the memory for each entry in the buffer, wherein each entry in the buffer comprises a data unit and one or more identification numbers.

13. A method comprising:
   receiving a first data unit;
   storing the first data unit in one of a number of buffers, the number of buffers equal to the number of memory banks in a memory;
   receiving a second data unit;
   storing the second data unit in the same buffer in which the first data unit was stored;
   receiving a third data unit;
   storing the third data unit in one of the number of buffers different from the buffer storing the first data unit; and
   scheduling a first, second, and third lookup in the memory bank corresponding to the buffer in which the first, second, and third data units are stored respectively, the third lookup scheduled to take place before the second lookup.

14. The method of claim 13, further comprising generating an identification number for each data unit and storing the identification number in the buffer along with the data unit.

15. The method of claim 14, further comprising searching the buffer in which each data unit will be stored to determine if the data unit has already been stored in the buffer.

16. The method of claim 15, further comprising appending the identification number of the data unit to an entry in the buffer that comprises the data unit if the data unit has already been stored in the buffer.

17. The method of claim 13, further comprising reading the first data unit from the buffer and searching the memory bank corresponding to the buffer for an entry comprising the first data unit.

18. The method of claim 17, further comprising reading the third data unit from the buffer and searching the memory bank corresponding to the buffer for an entry comprising the third data unit.

19. The method of claim 18, further comprising reading the second data unit from the buffer and searching the memory bank corresponding to the buffer for an entry comprising the second data unit after searching the memory for an entry comprising the third data unit.

20. The method of claim 13, further comprising receiving a fourth data unit, the fourth data unit a copy of the second data unit.

21. The method of claim 20, further comprising appending the identification of the fourth data unit to the entry in the buffer which comprises the second data unit.

22. The method of claim 21, further comprising scheduling one lookup in the memory bank for both the second and fourth data units.

23. A system comprising:

a memory;

a processor coupled to the memory via a bus;

a plurality of buffers to store a plurality of data units, the number of buffers based on a number of memory banks in the memory; and logic coupled to the memory and the plurality of buffers, the logic including:

a selector to select one of the plurality of buffers to which the data unit is to be stored based on at least a portion of the data unit; and a scheduler to schedule an access by the processor of one of the memory banks based on the buffer in which the data unit is stored.

24. The system of claim 23, wherein each buffer corresponds to a different memory bank in the memory.

25. The system of claim 23, wherein the scheduler to schedule an access of one of the memory banks comprises a scheduler to schedule sequential accesses of different memory banks.

26. An article of manufacture comprising:

a machine accessible medium comprising content that when accessed by a machine causes the machine to receive a data unit;

compute an index based on at least a portion of the data unit;

select a buffer in which to store the data unit based on the index;

store the data unit in the selected buffer;

schedule a memory bank access based on the index;

read the data unit from which the index was computed from the selected buffer; and access the memory bank as scheduled to search for an entry in the memory bank comprising the data unit.

27. The article of manufacture of claim 26, further comprising a machine accessible medium comprising content that when accessed by a machine causes the machine to generate an identification number for the data unit.

28. The article of manufacture of claim 27, wherein a machine accessible medium comprising content that when accessed by a machine causes the machine to store the data unit in the selected buffer comprises a machine accessible medium comprising content that when accessed by a machine causes the machine to store the identification number along with the data unit in the selected buffer.

* * * * *